United States Patent
Yang

(10) Patent No.: US 9,960,218 B2
(45) Date of Patent: May 1, 2018

(54) ORGANIC LIGHT-EMITTING DISPLAY SUBSTRATE, MANUFACTURING METHOD THEREFOR, AND ORGANIC LIGHT-EMITTING DISPLAY DEVICE

(71) Applicant: BOE TECHNOLOGY GROUP CO., LTD., Beijing (CN)

(72) Inventor: Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/321,451

(22) PCT Filed: Apr. 12, 2016

(86) PCT No.: PCT/CN2016/079037
§ 371 (c)(1),
(2) Date: Dec. 22, 2016

(87) PCT Pub. No.: WO2016/180136
PCT Pub. Date: Nov. 17, 2016

(65) Prior Publication Data
US 2017/0213879 A1    Jul. 27, 2017

(30) Foreign Application Priority Data

May 8, 2015 (CN) .......................... 2015 1 0232824

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3218* (2013.01); *H01L 27/3276* (2013.01);
(Continued)

(58) Field of Classification Search
None
See application file for complete search history.

(56) References Cited

U.S. PATENT DOCUMENTS

2004/0119066 A1   6/2004   Han et al.
2007/0152575 A1*  7/2007   Lee ..................... H01L 27/3246
                                                        313/506

(Continued)

FOREIGN PATENT DOCUMENTS

CN   1499907 A   5/2004
CN   1988742 A   6/2007
(Continued)

OTHER PUBLICATIONS

The First Chinese Office Action dated May 24, 2017; Appln. No. 201510232824.6.
(Continued)

*Primary Examiner* — Michelle Mandala
(74) *Attorney, Agent, or Firm* — Ladas & Parry LLP

(57) ABSTRACT

An organic light-emitting display substrate, a manufacturing method therefor, and an organic light-emitting display device. The organic light-emitting display substrate comprises a base substrate and multiple sub-pixels that are located on the base substrate and that are arranged in an array manner. Each sub-pixel comprises an organic light-emitting layer. At least one blocking element is disposed between two adjacent sub-pixels that emit light of different colors.

17 Claims, 5 Drawing Sheets

(52) U.S. Cl.
CPC .......... *H01L 51/5228* (2013.01); *H01L 51/56* (2013.01); *H01L 2227/323* (2013.01)

(56) References Cited

U.S. PATENT DOCUMENTS

| | | |
|---|---|---|
| 2010/0207107 A1 | 8/2010 | Kim |
| 2013/0059063 A1* | 3/2013 | Kawato .................. C23C 14/042 427/66 |

FOREIGN PATENT DOCUMENTS

| | | |
|---|---|---|
| CN | 1992333 A | 7/2007 |
| CN | 101800194 A | 8/2010 |
| CN | 103311265 A | 9/2013 |
| CN | 104867963 A | 8/2015 |

OTHER PUBLICATIONS

International Search Report and Written Opinion dated Jul. 15, 2016; PCT/CN2018079037.
The Second Chinese Office Action dated Feb. 23, 2018; Appln. No. 201510232824.6.

* cited by examiner

ORGANIC LIGHT-EMITTING DISPLAY SUBSTRATE, MANUFACTURING METHOD THEREFOR, AND ORGANIC LIGHT-EMITTING DISPLAY DEVICE

TECHNICAL FIELD

Embodiments of the present disclosure relate to an organic light-emitting display substrate and a fabrication method thereof, and an organic light-emitting display device.

BACKGROUND

An organic light-emitting display device comprises an organic light-emitting display substrate, and the organic light-emitting display substrate further comprises a base substrate and a plurality of sub-pixels arranged in an array on the base substrate. Therein, each sub-pixel includes an element such as an organic light-emitting layer provided on the base substrate. In order to display colorful images on the organic light-emitting display device, the plurality of sub-pixels have a sub-pixel emitting red light, a sub-pixel emitting green light and a sub-pixel emitting blue light. Materials are different in organic light-emitting layers within the sub-pixels emitting different colors of light.

SUMMARY

Embodiments of the present invention provide an organic light-emitting display substrate, comprising a base substrate and a plurality of sub-pixels arranged in an array on the base substrate, wherein, each of the sub-pixels includes an organic light-emitting layer, and at least one blocking element is provided between two adjacent sub-pixels emitting light of different colors.

In one embodiment of the present invention, for example, at least one blocking element is provided between two adjacent sub-pixels emitting light of a same color.

In one embodiment of the present invention, for example, a top end of the blocking element is higher than a top end of the organic light-emitting layer.

In one embodiment of the present invention, for example, only one blocking element is provided between two adjacent sub-pixels, each blocking element has a strip shape, a long side of each blocking element is parallel to a side edge of the sub-pixel which is close to the blocking element.

In one embodiment of the present invention, for example, a length of the long side of the blocking element is greater than or equal to a length of the side edge of the sub-pixel which is close to the blocking element.

In one embodiment of the present invention, for example, a plurality of blocking elements are provided between two adjacent sub-pixels, each blocking element has a strip shape, and a long side of each of the blocking element is parallel to a side edge of the sub-pixel which is close to the blocking element.

In one embodiment of the present invention, for example, an effective length of the plurality of blocking elements in a direction parallel to the side edge of the sub-pixel which is close to the blocking element is greater than or equal to the length of the side edge of the sub-pixel which is close to the blocking element.

In one embodiment of the present invention, for example, the plurality of blocking elements between two adjacent sub-pixels are arranged in a staggered manner, and there is a gap between two adjacent blocking elements.

In one embodiment of the present invention, for example, a length of the long side of each blocking element is less than a length of the side edge of each blocking element.

In one embodiment of the present invention, for example, the organic light-emitting display substrate further comprising: a cathode layer covering the organic light-emitting layer and the blocking element, wherein the top end of the blocking element has a circular arc shape.

In one embodiment of the present invention, for example, the sub-pixel further includes an anode layer located between the organic light-emitting layer and the base substrate, and the organic light-emitting display substrate further comprises a pixel defining layer located above the anode layer, the pixel defining layer located between two adjacent sub-pixels has a vertical section of a circular arc shape, the blocking element is located on the pixel defining layer, or, the blocking element passes through the pixel defining layer.

In one embodiment of the present invention, for example, the blocking element passes through the pixel defining layer, and the organic light-emitting display substrate further comprises an auxiliary electrode layer located below the organic light-emitting layer.

In one embodiment of the present invention, for example, wherein, a material of the blocking element comprises a metal, and the auxiliary electrode layer is electrically connected with the cathode layer via the blocking element.

In one embodiment of the present invention, for example, the at least one blocking element surrounds the plurality of the sub-pixels arranged in an array, to form a pixel defining layer.

In one embodiment of the present invention, for example, the blocking element includes a bottom of a circular arc shape and a top located above the bottom, and a top end of the top has a circular arc shape.

Embodiments of the present invention provide an organic light-emitting display device, comprising the above described organic light-emitting display substrate.

Embodiments of the present invention provide a fabrication method of an organic light-emitting display substrate, comprising: forming at least one blocking element between two adjacent sub-pixels emitting light of different colors on a base substrate; forming an organic light-emitting layer in each of the sub-pixels; wherein, the organic light-emitting layer is formed after forming the blocking element.

In one embodiment of the present invention, for example, in the fabrication method, forming an organic light-emitting layer in each of the sub-pixels comprises: covering the base substrate on which the blocking element is formed with a mask, and bringing the mask into contact with a top end of the blocking element, and forming the organic light-emitting layer in each of the sub-pixels by an evaporating process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

| Reference signs: | | |
| --- | --- | --- |
| 1- base substrate; | 2-sub-pixel; | 21-organic light-emitting layer; |
| 22-anode layer; | 3-blocking element; | 4-cathode layer; |
| 5-pixel defining layer: | 6-mask; | 7-auxiliary electrode layer. |

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In a conventional technology, an organic light-emitting layer in an organic light-emitting display substrate can be fabricated through the following proceedings: successively evaporating an organic light-emitting layer in a sub-pixel emitting red light, an organic light-emitting layer in a sub-pixel emitting green light and an organic light-emitting layer in a sub-pixel emitting blue light. The above-described evaporating processes are the same, and with the organic light-emitting layer in the sub-pixel emitting red light as an example, a fabrication process of the organic light-emitting layer is illustrated. Firstly, a base substrate is covered with a mask; then, a material of the organic light-emitting layer is evaporated by using an evaporating source on the base substrate. In order to ensure that a impurity on the mask does not come into contact with the base substrate, the mask needs to be located a certain distance from the base substrate; and in order to ensure uniform distribution of the organic light-emitting layer, during the evaporating process, the evaporating source needs to move continuously with respect to the base substrate.

Figure 1:
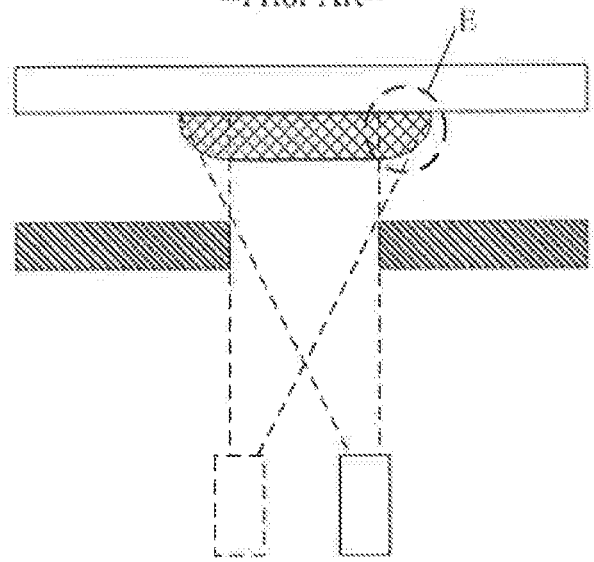
FIG. 1 is a schematic diagram of an evaporation shadow region in a conventional method.

However, inventors of the present application find that: since during the evaporating process, the evaporating source moves continuously with respect to the base substrate, after the organic light-emitting layer in the sub-pixel emitting red light is evaporated, an evaporation shadow region E as shown in FIG. 1 will be generated on an edge of the organic light-emitting layer in the sub-pixel emitting red light, so that the material of the organic light-emitting layer in the sub-pixel emitting red light enters the sub-pixel emitting green light or the sub-pixel emitting blue light adjacent thereto, thereby causing color mixing between adjacent sub-pixels emitting light of different colors, which further affects a display effect of the organic light-emitting display device.

The embodiments of the present disclosure propose technical solutions as follows.

Embodiment One

Figure 2:
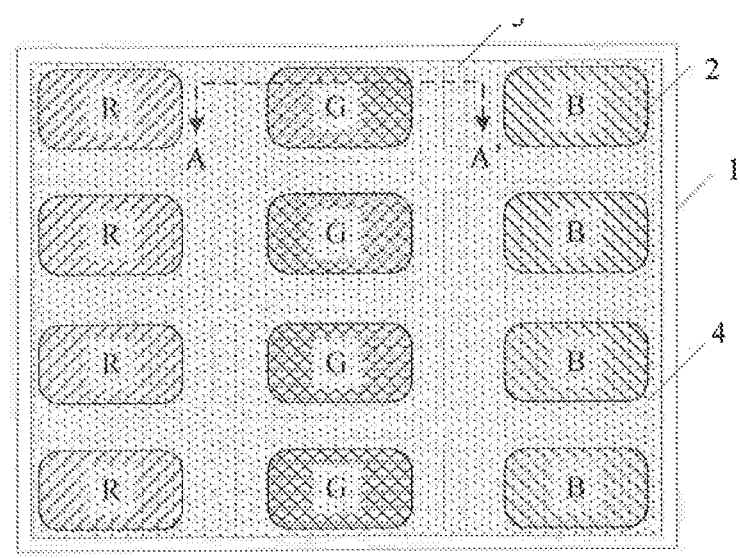
FIG. 2 is a schematic diagram of a first arrangement mode of sub-pixels in an embodiment of the present disclosure.
Figure 3:
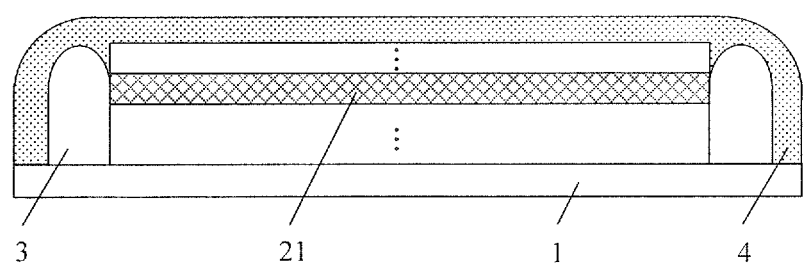
FIG. 3 is a cross-sectional diagram along a line A-A' of FIG. 2.

The embodiment of the present disclosure provides an organic light-emitting display substrate, and as shown in FIG. 2 and FIG. 3, the organic light-emitting display substrate comprises a base substrate 1 and a plurality of sub-pixels 2 arranged in an array on the base substrate 1, each sub-pixel 2 includes an organic light-emitting layer 21, and a blocking element 3 is provided between two adjacent sub-pixels 2 emitting light of different colors.

Figure 4:
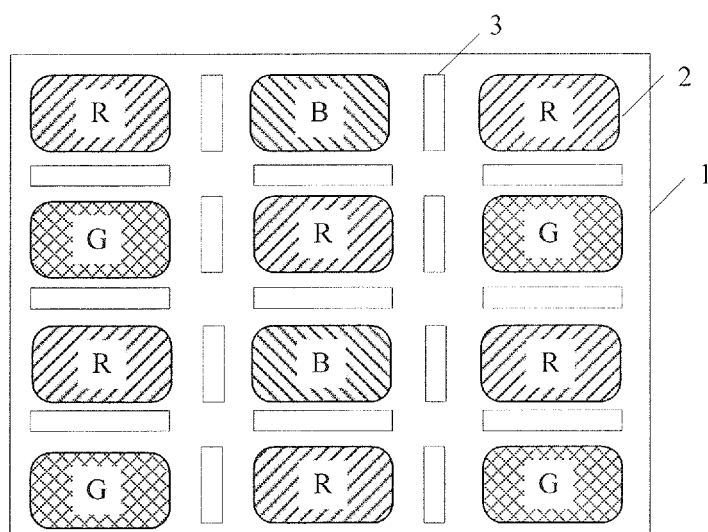
FIG. 4 is a schematic diagram of a second arrangement mode of sub-pixels in the embodiment of the present disclosure.
Figure 5:
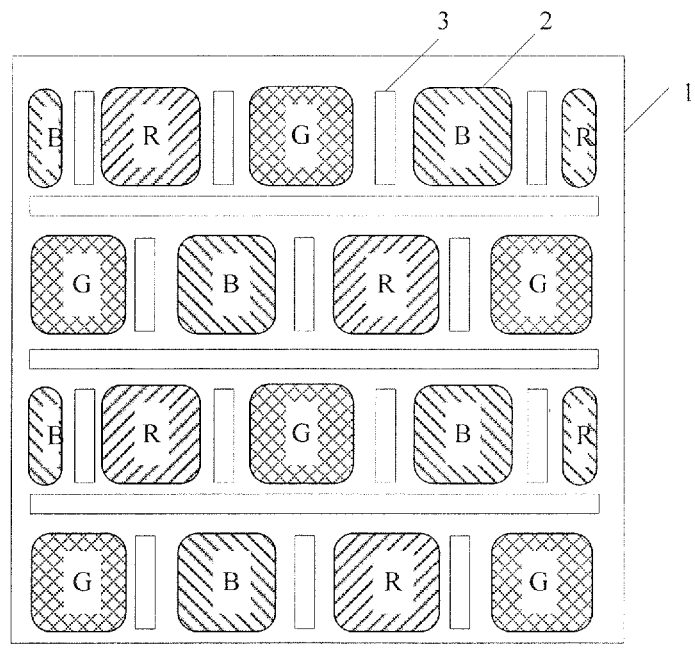
FIG. 5 is a schematic diagram of a third arrangement mode of sub-pixels in the embodiment of the present disclosure.

In the above-described embodiment, for example, the plurality of sub-pixels 2 arranged in an array include a sub-pixel R emitting red light, a sub-pixel G emitting green light and a sub-pixel B emitting blue light, such that a colorful image can be displayed by the organic light-emitting display device; in addition, the plurality of sub-pixels 2 arranged in an array may further include a sub-pixel W emitting white light, so that display brightness of the image displayed can be increased. When the plurality of sub-pixels 2 includes the three kinds of sub-pixels, i.e., R, G, and B, there are a plurality of arrangement modes of the three kinds of sub-pixels, i.e., R, G, and B. For example, the plurality of sub-pixels 2 may be arranged in a mode as shown in FIG. 2, i.e., sub-pixels 2 in a same column emit light of a same color, and sub-pixels 2 in two adjacent columns emit light of different colors. In this case, the blocking element 3 as shown in FIG. 2 may be provided between any two adjacent sub-pixels 2 emitting light of different colors; and the plurality of sub-pixels 2 may also be arranged in a mode as shown in FIG. 4 and FIG. 5, i.e., sub-pixels 2 emitting light of different colors are arranged at intervals. In this case, the blocking element 3 as shown in FIG. 4 and FIG. 5 may be respectively provided between the two adjacent sub-pixels 2 emitting light of different colors. When the plurality of sub-pixels 2 includes the sub-pixels, i.e., R, G, B and W, the plurality of sub-pixels 2 may be arranged with reference to the above-described mode.

Figure 6:
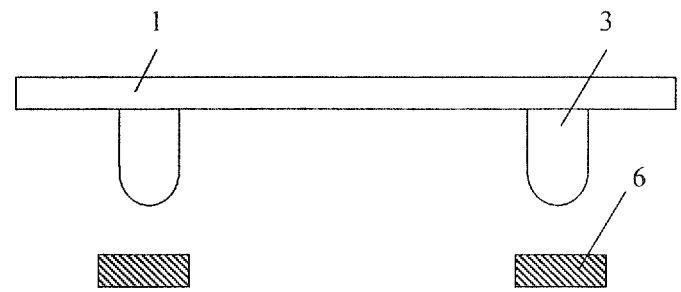
FIG. 6 is a schematic diagram of a positional relationship between a mask and a blocking element in the embodiment of the present disclosure.

As shown in FIG. 3, in the plurality of sub-pixels 2 arranged in an array, each sub-pixel 2 includes an organic light-emitting layer 21. For example, materials are different in the organic light-emitting layers 21 in the sub-pixels 2 emitting light of different colors, and materials may be the same in the organic light-emitting layers 21 in the sub-pixels 2 emitting light of a same color. Therefore, the organic light-emitting layers 21 in the sub-pixels 2 emitting light of a same color may be fabricated at the same time, which can further simplify the fabrication process of the organic light-emitting display substrate. Hereinafter, take the organic light-emitting layer 21 in the sub-pixel G emitting green light as an example, the process of fabricating the organic light-emitting layer 21 is described: as shown in FIG. 6, firstly, the base substrate 1 provided with the blocking element 3 is covered with the mask 6, wherein, the blocking element 3 corresponds to a shielding region of the mask 6; then the evaporating source moves continuously with respect to the base substrate 1, to evaporate the evenly distributed material of the organic light-emitting layer on the base substrate 1, and during the evaporating process, the above-described blocking element 3 may at least partly block the material of the organic light-emitting layer 21 from being evaporated into the adjacent sub-pixel 2.

In the above-described embodiment, since the blocking element 3 is provided between the two adjacent sub-pixels 2 emitting light of different colors, and the organic light-emitting layer 21 is formed after forming the blocking element 3, in the process of evaporating the organic light-emitting layer 21, the blocking element 3 may at least partly block the evaporating source from evaporating the material of the organic light-emitting layer 21 into the sub-pixel 2 emitting light of different colors adjacent thereto, which can thus reduce a color mixing phenomenon between two adjacent sub-pixels 2 emitting light of different colors caused by the evaporation shadow region in the conventional method, and improve the display quality of the organic light-emitting display device.

It should be noted that, when the plurality of sub-pixels 2 can be arranged in the mode as shown in FIG. 2, the two adjacent sub-pixels 2 may emit light of a same color, and also may emit light of different colors. When the plurality of sub-pixels 2 are arranged in the mode as shown in FIG. 4 and FIG. 5, the two adjacent sub-pixels 2 emit light of different colors. Hereinafter, with the arrangement mode as shown in FIG. 2 as an example, a structure of the organic light-emitting display substrate will be described as follows.

As shown in FIG. 2, in order to eliminate the uneven distribution phenomenon of the material of the organic light-emitting layer 21 in the two adjacent sub-pixels 2 emitting light of a same color caused by the evaporation shadow region, in the plurality of sub-pixels 2 arranged in an array, a blocking element 3 is also provided between the two adjacent sub-pixels 2 emitting light of a same color. In this case, each sub-pixel 2 includes the organic light-emitting layer 21, and the organic light-emitting layer 21 is formed after forming the blocking element 3, and thus, in the process of evaporating the organic light-emitting layer 21, the blocking element 3 may at least partly block the evaporating source from evaporating the material of the organic light-emitting layer 21 into the adjacent sub-pixel 2 emitting light of a same color, which can thus reduce the uneven distribution phenomenon of the material of the organic light-emitting layer 21 in the two adjacent sub-pixels 2 emitting light of a same color caused by the evaporation shadow region in the conventional method, can reduce a phenomenon of uneven light emission of the sub-pixel 2 caused by uneven distribution of the material of the organic light-emitting layer 21, and further improve the display quality of the organic light-emitting display device.

In the above-described embodiment, a height of the blocking element 3 may be set as that: with respect to the base substrate, a top end of the blocking element 3 is lower than a top end of the organic light-emitting layer 21, and higher than a bottom end of the organic light-emitting layer 21; or, the top end of the blocking element 3 and the top end of the organic light-emitting layer 21 are equal in height; or, the top end of the blocking element 3 is higher than the top end of the organic light-emitting layer 21. For example, as shown in FIG. 3, the top end of the blocking element 3 is higher than the top end of the organic light-emitting layer 21. In this case, during the process of evaporating the organic light-emitting layer 21, the mask comes into contact with the blocking element 3, and the material in the organic light-emitting layer 21 cannot pass through the top end of the blocking element 3 to arrive in the adjacent sub-pixel 2; in addition, when the mask comes into contact with the blocking element 3, the mask has a certain distance from the organic light-emitting layer 21, so that the foreign matter on the mask cannot arrive on the organic light-emitting layer 21. For example, when the mask is in contact with the blocking element 3, a distance between the mask and the organic light-emitting layer 21 is 5 µm, and a diameter of the foreign matter on the mask is 2 µm, and thus, the foreign matter still has a certain distance from the organic light-emitting layer 21, so that the foreign matter cannot arrive on the organic light-emitting layer 21. In addition, the top end of the blocking element 3 is higher than the top end of the organic light-emitting layer 21, which also enables the blocking element 3 to function to support an organic light-emitting display panel, so that it may protect performance of elements such as the organic light-emitting layer 21 in the organic light-emitting display panel from being harmed, when the organic light-emitting display panel is squeezed by an external force.

In the above-described embodiment, the blocking element 3 is provided between the two adjacent sub-pixels 2, which at least include two following cases:

In a first case, as shown in FIG. 2, in order to reduce a fabrication cost of the organic light-emitting display device, a blocking element 3 is provided between the two adjacent sub-pixels 2, each blocking element 3 has a strip shape, a long side of each blocking element 3 is parallel to a side edge of the sub-pixel 2 which is close to the blocking element 3, and a length of the long side of the blocking element 3 is greater than or equal to a length of the above-described side edge. Therein, the above-described strip shape only indicates that the blocking element 3 has a long side, and the long side is parallel to the side edge of the sub-pixel 2 which is close to the blocking element 3, and a shape of the blocking element 3 is not limited. For example, the shape of the blocking element 3 may be a cuboid, or may be a trapezoid. It can be known from design of the length of the long side of the blocking element 3, in combination with the height of the blocking element 3 that, in the process of evaporating the organic light-emitting layer 21, the blocking element 3 can prevent the material of the organic light-emitting layer 21 from passing through both sides of the long sides of the blocking element 3 and the top end of the blocking element 3 to arrive in the adjacent sub-pixel 2, which thereby can completely prevent color mixing between the two adjacent sub-pixels 2 emitting light of different colors. In addition, when the above-described blocking element 3 is provided between any two adjacent sub-pixels 2, color mixing between any two adjacent sub-pixels 2 emitting light of different colors can be completely prevented, and uneven light emission of the sub-pixel 2 can be completely eliminated.

In the first case, as shown in FIG. 2 and FIG. 3, the blocking element 3 is provided between any two adjacent sub-pixels 2, and the organic light-emitting display substrate further comprises a cathode layer 4 covering the organic light-emitting layer 21 and the blocking element 3. In order to prevent an open circuit of the cathode layer 4 caused by breakage of the cathode layer 4 at the blocking element 3 due to a large height of the blocking element 3, the length of the above-described blocking element 3 is set, for example, in such a way that the length of the long side of the blocking element 3 is equal to the length of the above-described side edge. In this case, when the blocking element 3 is provided between any two adjacent sub-pixels 2, the blocking element 3 around the organic light-emitting layer 21 is not closed. Even if breakage of the cathode layer 4 occurs at the blocking element 3 due to a large height of the blocking element 3, a portion of the cathode layer 4 corresponding to the above-described organic light-emitting layer 21 and other portions of the cathode layer 4 still can be electrically connected through the cathode layer 4 at a gap between the two adjacent blocking elements 3.

Figure 7:
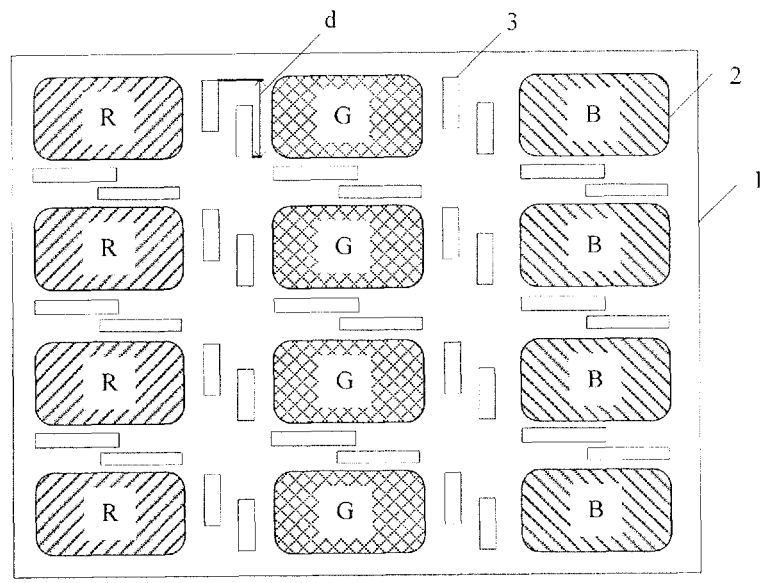
FIG. 7 is a schematic diagram of a first arrangement mode of the blocking elements in the embodiment of the present disclosure.
Figure 8:
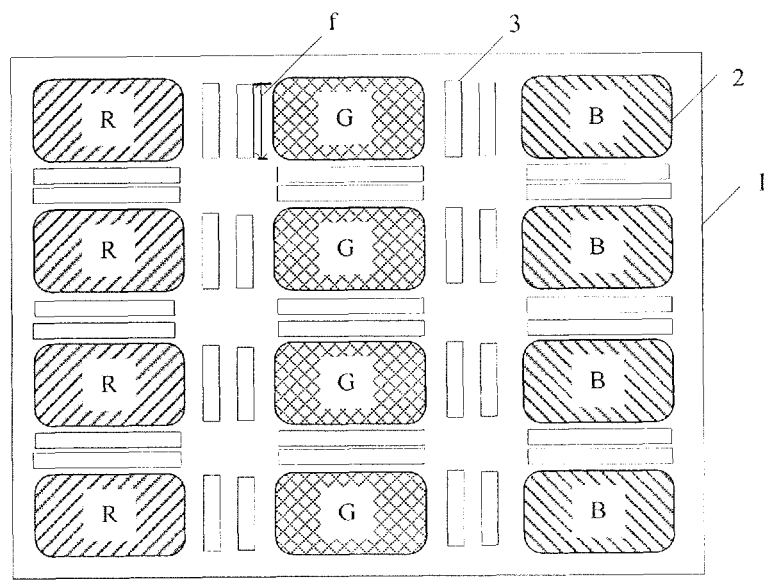
FIG. 8 is a schematic diagram of a second arrangement mode of the blocking elements in the embodiment of the present disclosure.

In a second case, as shown in FIG. 7 and FIG. 8, during the process of evaporating the organic light-emitting layer 21, the mask may not come into contact with the blocking element 3. At this time, in order to prevent the material of the organic light-emitting layer 21 from being evaporated into the adjacent sub-pixel 2, a plurality of blocking elements 3 may be provided between the two adjacent sub-pixels 2; each blocking element 3 has a strip shape, long sides of each blocking element 3 are parallel to the side edge of the sub-pixel 2 which is close to the blocking element 3; and an effective length of the long side of the plurality of blocking elements 3 provided between the two adjacent sub-pixels 2 is greater than or equal to the length of the above-described side edge. Therein, the above-described strip shape only indicates that the blocking element 3 has a long side, and the long side is parallel to the side edge of the sub-pixel 2 which is close to the blocking element 3, and a shape of the blocking element 3 is not limited. For example, the shape of the blocking element 3 may be a cuboid, or may be a trapezoid. The above-described effective length refers to an uninterrupted length between two end points, i.e., a starting point and an end point, of the plurality of blocking elements 3. For example, as shown in FIG. 7, two blocking elements 3 are provided between two adjacent sub-pixels 2, and in a direction parallel to the side edge of the sub-pixel 2, the two blocking elements 3 have an effective length of d; and for another example, as shown in FIG. 8, two blocking elements 3 are provided between the two adjacent sub-pixels 2, and in a direction parallel to the side edge of the sub-pixel 2, the two blocking elements 3 have an effective length of f. In this case, during the process of evaporating the organic light-emitting layer 21, even if the mask does not come into contact with the blocking element 3, color mixing between the two adjacent sub-pixels 2 emitting light of different colors can be completely prevented as well. In addition, when the above-described blocking element 3 is provided between any two adjacent sub-pixels 2, color mixing between any two adjacent sub-pixels 2 emitting light of different colors can be completely prevented, and uneven light emission of the sub-pixel 2 can be completely eliminated.

In the second case, further, the organic light-emitting display substrate further comprises a cathode layer 4 covering the organic light-emitting layer 21 and the blocking element 3. A plurality of blocking elements 3 are provided between any two adjacent sub-pixels 2, in order to avoid an open circuit of the cathode layer 4 caused by breakage of the cathode layer 4 at the above-described blocking element 3, as shown in FIG. 7 and FIG. 8, a plurality of blocking elements 3 are provided between any two adjacent sub-pixels 2, and a gap is set between two adjacent blocking elements 3. In this case, even if breakage of the cathode layer 4 occurs at the above-described blocking element 3, a portion of the cathode layer 4 corresponding to the organic light-emitting layer 21 and other portions of the cathode layer 4 still can be electrically connected through the cathode layer 4 at a gap between the two blocking elements 3; and in order that the portion of the cathode layer 4 corresponding to the organic light-emitting layer 21 and other portions of the cathode layer 4 are more easily connectable, as shown in FIG. 7, the plurality of blocking elements 3 between two adjacent sub-pixels 2 emitting light of a same color and/or emitting light of different colors are arranged in a staggered manner, and the length of the long side of each blocking element 3 is less than the length of the above-described side edge. In this case, as compared with the case where the length of the long side of each blocking element 3 is greater than or equal to the length of the above-described side edge, the portion of the cathode layer 4 corresponding to the organic light-emitting layer 21 and other portions of the cathode layer 4 may be electrically connected through more area of the cathode layer 4, so that electrical connection between the portion of the cathode layer 4 corresponding to the organic light-emitting layer 21 and other portions of the cathode layer 4 is not tend to encounter a broken circuit; in addition, the length of the long side of each blocking element 3 is less than the length of the above-described side edge, which can save a fabrication cost of the organic light-emitting display substrate.

It should be noted that, the arrangement mode of the blocking element 3 between the two adjacent sub-pixels 2 may further include that: in the plurality of sub-pixels 2 arranged in an array, regarding part of the sub-pixels, only one blocking element 3 is provided between two adjacent sub-pixels 2, and regarding the other part of the sub-pixels, a plurality of blocking elements 3 are provided between two adjacent sub-pixels 2; or, regarding part of the sub-pixels, there is no blocking element 3 between two adjacent sub-pixels 2. No more description is repeated here.

In the above-described embodiment, as shown in FIG. 3, in order to prevent breakage of the cathode layer 4 at a position where the side edge and the top end of the blocking element 3 are connected, the top end of the blocking element 3 is designed to have a circular arc shape. In this way, an angle of the cathode layer 4 climbing up the blocking element 3 can be reduced; as a result, breakage of the cathode layer 4 at the position where the side edge and the top end of the blocking element 3 are connected may be avoided.

Figure 9:
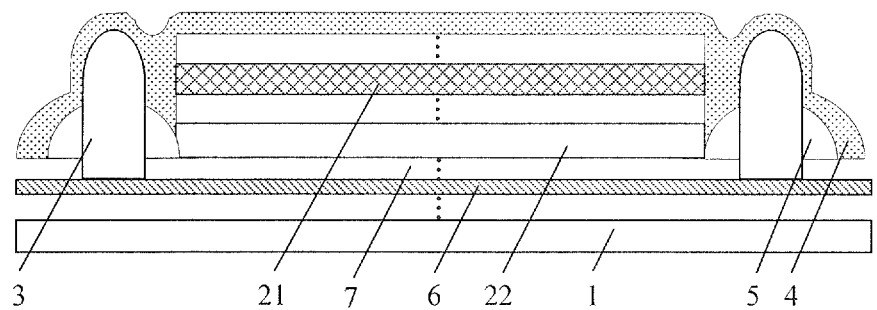
FIG. 9 is a structural schematic diagram of an organic light-emitting display substrate in an embodiment of the present disclosure.

In the above-described embodiment, further, as shown in FIG. 9, the sub-pixel 2 further includes an anode layer 22 located between the organic light-emitting layer 21 and the base substrate 1, and the organic light-emitting display substrate further comprises a pixel defining layer 5 located above the anode layer 22, the pixel defining layer 5 located between two adjacent sub-pixels 2 has a circular arc shape, the blocking element 3 is located on the pixel defining layer 5; or, the blocking element 3 passes through the pixel defining layer 5. The pixel defining layer 5 is combined with the blocking element 3 whose top end has a circular arc shape, so that the side edge of the blocking element 3 and the side edge of the pixel defining layer 5 located at the bottom end of the blocking element 3 both gradually rise, which can further reduce the angle for the cathode layer 4 climbing up the blocking element 3, and thus breakage of the cathode layer 4 at the position of the blocking element 3 can be avoided.

It should be noted that, when the above-described blocking element 3 is provided between any two adjacent sub-pixels 2, the blocking elements 3 surround the plurality of sub-pixels 2 arranged in an array, and at this time, the pixel defining layer 5 is helpful for eliminating area difference of the anode layers 22 in the respective sub-pixels 2 and defect of uneven surface of the anode layer 22 due to limitation of the fabrication process of the anode layer 22. When the above-described blocking element 3 is provided between part of adjacent two sub-pixels 2, the pixel defining layers 5 surround the plurality of sub-pixels 2 arranged in an array, and are helpful for eliminating area difference of the anode layers 22 in the respective sub-pixels 2 and defect of uneven surface of the anode layer 22 due to limitation of the fabrication process of the anode layer 22.

In the above-described embodiment, the blocking element 3 may be located on the pixel defining layer 5, and at this time, the blocking element 3 may be made of a metal material or a polyimide material. For example, the height of the blocking element 3 may be from 1 μm to 1000 μm, and the blocking element 3 may also pass through the pixel defining layer 5, and at this time, the blocking element 3 may be made of a metal material. In order to reduce an uneven brightness phenomenon of the image displayed caused by voltage drop of the cathode layer 4, for example, the blocking element 3 passes through the pixel defining layer 5. At this time, the organic light-emitting display substrate may further comprise an auxiliary electrode layer 7 located below the organic light-emitting layer 21. For example, as shown in FIG. 9, the auxiliary electrode layer 7 is located below the anode layer 22 and above the base substrate 1, and is insulated from the anode layer 22. The blocking element 3 is made of a metal material, and the auxiliary electrode layer 7 is electrically connected with the cathode layer 4 via the blocking element 3. In this case, it is equivalent to that the cathode layer 4 is connected in parallel with a resistor via the blocking element 3, which thus can reduce resistance of the cathode layer 4; in a conventional technology, since the resistance of the cathode layer 4 is relatively great, the voltage drop thereof is relatively great, but in the embodiment of the present disclosure, the resistance of the cathode layer 4 is reduced, and the voltage drop of the cathode layer 4 can be reduced, which can further reduce the uneven brightness phenomenon of the image displayed caused by greater voltage drop of the cathode layer 4. For example, the auxiliary electrode layer 7 may be made of a metal material, and may also be made of an indium tin oxide material. The metal material has an advantage of a smaller resistance. For example, a shape of the auxiliary electrode layer 7 may be a block structure located above the base substrate 1; and may also be a planar structure located above the base substrate 1; and may also be a gridding structure, whose bar member is in contact with the blocking element 3. In addition, the organic light-emitting display substrate having the above-described auxiliary electrode layer 7 may be used in a top-emitting display device or in a bottom-emitting display device. When it is used in the top-emitting display device, the auxiliary electrode layer 7 may be made of a metal material and an indium tin oxide material; and when it is provided in the bottom-emitting display device, the auxiliary electrode layer 7 may be made of an indium tin oxide material. For example, the auxiliary electrode layer 7 is provided in the top-emitting display device, since the auxiliary electrode layer 7 is not provided on a light-emitting side, transmittance of light beam can be improved; further, the auxiliary electrode layer 7 may be made of a metal material, and thus it is possible to effectively eliminate the phenomenon of uneven brightness of the image displayed caused by greater voltage drop of the cathode layer 4.

Figure 10:
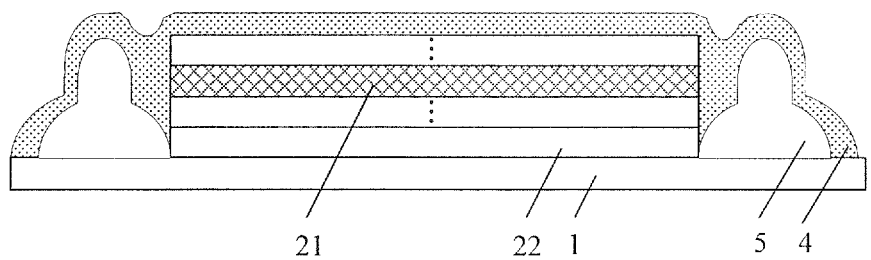
FIG. 10 is a structural schematic diagram of another organic light-emitting display substrate in the embodiment of the present disclosure.

In addition, as shown in FIG. 10, in order to simplify the fabrication process of the organic light-emitting display substrate, the above-described pixel defining layer 5 may further be directly set as the blocking element 3, that is, the organic light-emitting display device comprises the pixel defining layer 5 surrounding the plurality of sub-pixels 2 arranged in an array, the pixel defining layer 5 located between two adjacent sub-pixels 2 includes a bottom of a circular arc shape and a top located on the bottom, a top end of the top has a circular arc shape, and the pixel defining layer 5 play the role of a blocking element 3 at the same time. In this case, it is not necessary to additionally fabricate the blocking element 3, which can simplify the fabrication process of the organic light-emitting display substrate. At this time, related description of the structure of the above-described blocking element 3 can be referred to for a specific structure of the top of the pixel defining layer 5. In addition, it should also be noted that, in order to prevent electrical connection between the anode layers 22 in two adjacent sub-pixels 2, the pixel defining layer 5 is made of an insulating material.

Further, the organic light-emitting display substrate may further comprise elements such as a hole injection layer and a hole transport layer (not shown) provided between the anode layer 22 and the organic light-emitting layer 21 and successively stacked on the anode layer 22. And it may further include elements such as an electron transport layer and an electron injection layer (not shown) provided between the organic light-emitting layer 21 and the cathode layer 4 and successively stacked on the organic light-emitting layer 21.

An embodiment of the present disclosure further provides an organic light-emitting display device, comprising the organic light-emitting display substrate proposed by the above-described technical solution. Therein, the organic light-emitting display device may be: electric-paper, a mobile phone, a tablet computer, a television, a monitor, a laptop, a digital photo frame, a navigator, or any other product or component having a display function.

Embodiment Two

Figure 11:
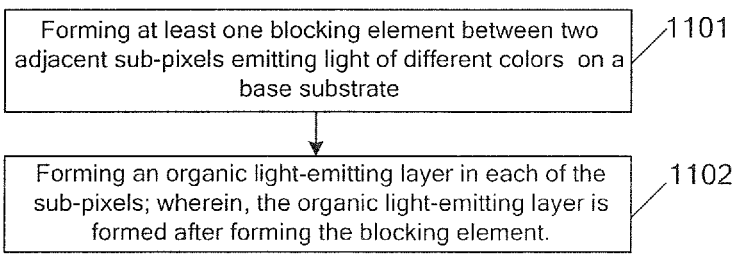
FIG. 11 is a flowchart of a fabrication method of an organic light-emitting display substrate in an embodiment of the present disclosure.

The embodiment of the present disclosure provides a fabrication method of an organic light-emitting display substrate, as shown in FIG. 11, comprising:

Step 1101: forming a blocking element between two adjacent sub-pixels emitting light of different colors on a base substrate. For example, a blocking element layer is formed on the base substrate by a method such as plasma enhanced chemical vapor deposition, sputtering or thermal evaporation; and then, a pattern including the blocking element between two adjacent sub-pixels emitting light of different colors is formed by a patterning process.

Step 1102: forming an organic light-emitting layer in each sub-pixel. For example, the sub-pixels are arranged in an array, and the plurality of sub-pixels arranged in an array have a sub-pixel emitting red light, a sub-pixel emitting green light and a sub-pixel emitting blue light. The proceeding of forming an organic light-emitting layer in each sub-pixel may include: firstly, forming an organic light-emitting layer in the sub-pixel emitting red light by an evaporating process; then forming an organic light-emitting layer in the sub-pixel emitting green light by an evaporating process; next, forming an organic light-emitting layer in the sub-pixel emitting blue light by an evaporating process; and thereby, implementing forming an organic light-emitting layer in each sub-pixel. Therein, the organic light-emitting layer is formed after forming blocking element.

In the above-described embodiment, since the blocking member is formed between the two adjacent sub-pixels emitting light of different colors located on the base substrate, and the organic light-emitting layer is formed after forming the blocking member, in the process of evaporating the organic light-emitting layer, the blocking member may at least partly block the evaporating source from evaporating the material of the organic light-emitting layer into the adjacent sub-pixel emitting light of different colors, which can thus eliminate a color mixing phenomenon between two adjacent sub-pixels emitting light of different colors caused by the evaporation shadow region in a conventional method, and improve a display quality of the organic light-emitting display device.

For example, in step 1102, the step of forming an organic light-emitting layer in each sub-pixel, may include, for example: covering the base substrate on which the blocking element is formed with a mask, and bringing the mask into contact with a top end of the blocking element, and forming the organic light-emitting layer in each sub-pixel by an evaporating process. Since the mask comes into contact with the top end of the blocking member, during the process of evaporating the organic light-emitting layer, the material in the organic light-emitting layer cannot pass through the top end of the blocking member to arrive in the adjacent sub-pixel, which thus can prevent color mixing between two adjacent sub-pixels emitting light of different colors.

All the embodiments in the description are described in a progressive manner, the same and similar parts among all the embodiments can refer to each other, and each embodiment focuses on description of differences from other embodiments. Particularly, the method embodiment is basically similar with the apparatus embodiment, so the description of the method embodiment is relatively simple, and related parts can refer to part of description of the method embodiment.

The above are only the model implementation ways of the present disclosure, and not used to limit the scope of protection of the present disclosure, the scope of protection of the present disclosure is determined by the attached claims.

The present application claims the priority of the Chinese Patent Application No. 201510232824.6 filed on May 8, 2015, which is incorporated herein by reference as part of the disclosure of the present application.

What is claimed is:

1. An organic light-emitting display substrate, comprising a base substrate and a plurality of sub-pixels arranged in an array on the base substrate,
   wherein, each of the sub-pixels includes an organic light-emitting layer, and at least one blocking element is provided between two adjacent sub-pixels emitting light of different colors;
   wherein, a plurality of blocking elements are provided between two adjacent sub-pixels, each the blocking element has a strip shape, and a long side of each blocking element is parallel to a side edge of the sub-pixel which is close to the blocking element; the plurality of blocking elements between two adjacent sub-pixels are arranged in a staggered manner, and there is a gap between two adjacent blocking elements.

2. The organic light-emitting display substrate according to claim 1, wherein, at least one blocking element is provided between two adjacent sub-pixels emitting light of a same color.

3. The organic light-emitting display substrate according to claim 1, wherein, a top end of the blocking element is higher than a top end of the organic light-emitting layer.

4. The organic light-emitting display substrate according to claim 1, wherein, only one blocking element is provided between two adjacent sub-pixels, each of the blocking element has a strip shape, a long side of each blocking element is parallel to a side edge of the sub-pixel which is close to the blocking element.

5. The organic light-emitting display substrate according to claim 4, wherein, a length of the long side of the blocking element is greater than or equal to a length of the side edge of the sub-pixel which is close to the blocking element.

6. The organic light-emitting display substrate according to claim 1, wherein, an effective length of each blocking element in a direction parallel to the side edge of the sub-pixel which is close to the blocking element is greater than or equal to the length of the side edge of the sub-pixel which is close to the blocking element.

7. The organic light-emitting display substrate according to claim 1, wherein, a length of the long side of each of the blocking elements is less than a length of the side edge of each of the blocking elements.

8. The organic light-emitting display substrate according to claim 1, further comprising:
   a cathode layer covering the organic light-emitting layer and the blocking element, wherein the top end of the blocking element has a circular arc shape.

9. The organic light-emitting display substrate according to claim 8, wherein, the sub-pixel further includes an anode layer located between the organic light-emitting layer and the base substrate, and
   the organic light-emitting display substrate further comprises a pixel defining layer located above the anode layer, the pixel defining layer located between two adjacent sub-pixels has a vertical section of a circular arc shape, and the blocking element is located on the pixel defining layer, or, the blocking element passes through the pixel defining layer.

10. The organic light-emitting display substrate according to claim 9, wherein, the blocking element passes through the pixel defining layer, and the organic light-emitting display substrate further comprises an auxiliary electrode layer located below the organic light-emitting layer.

11. The organic light-emitting display substrate according to claim 10, wherein, a material of the blocking element comprises a metal, and the auxiliary electrode layer is electrically connected with the cathode layer via the blocking element.

12. The organic light-emitting display substrate according to claim 1, wherein, the at least one blocking element surrounds the plurality of the sub-pixels arranged in an array, so as to form a pixel defining layer.

13. The organic light-emitting display substrate according to claim 12, wherein the blocking element includes a bottom of a circular arc shape and a top located above the bottom, and a top end of the top has a circular arc shape.

14. An organic light-emitting display device, comprising the organic light-emitting display substrate according to claim 1.

15. A fabrication method of an organic light-emitting display substrate, comprising:
   forming at least one blocking element between two adjacent sub-pixels emitting light of different colors on a base substrate; and
   forming an organic light-emitting layer in each of the sub-pixels;
   wherein, the organic light-emitting layer is formed after forming the blocking element;

wherein, forming an organic light-emitting layer in each of the sub-pixels comprises:
covering the base substrate on which the blocking element is formed with a mask,
bringing the mask into contact with a top end of the blocking element, and
forming the organic light-emitting layer in each of the sub-pixels by an evaporating process.

16. The organic light-emitting display substrate according to claim 2, wherein, a top end of the blocking element is higher than a top end of the organic light-emitting layer.

17. The organic light-emitting display substrate according to claim 2, wherein, only one blocking element is provided between two adjacent sub-pixels, each of the blocking element has a strip shape, a long side of each blocking element is parallel to a side edge of the sub-pixel which is close to the blocking element.

* * * * *